United States Patent
Yoon et al.

(10) Patent No.: US 8,338,241 B2
(45) Date of Patent: Dec. 25, 2012

(54) METHOD OF MANUFACTURING HIGH FREQUENCY DEVICE STRUCTURE

(75) Inventors: Hyung Sup Yoon, Daejeon (KR); Byoung-Gue Min, Daejeon (KR); Hokyun Ahn, Daejeon (KR); Sang-Heung Lee, Daejeon (KR); Hae Cheon Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/283,626

(22) Filed: Oct. 28, 2011

(65) Prior Publication Data

US 2012/0142148 A1 Jun. 7, 2012

(30) Foreign Application Priority Data

Dec. 6, 2010 (KR) .................. 10-2010-0123566

(51) Int. Cl.
*H01L 21/338* (2006.01)
(52) U.S. Cl. .. 438/172; 438/182; 438/575; 257/E21.403
(58) Field of Classification Search .............. 438/167, 438/172, 176, 182, 575, 576, 579; 257/194, 257/E21.403, E21.407
See application file for complete search history.

(56) References Cited

U.S. PATENT DOCUMENTS

| | | | | |
|---|---|---|---|---|
| 6,166,404 A | * | 12/2000 | Imoto et al. | 257/279 |
| 6,307,221 B1 | * | 10/2001 | Danzilio | 257/192 |
| 7,655,546 B2 | | 2/2010 | Wohlmuth | |
| 7,709,269 B2 | * | 5/2010 | Smith et al. | 436/182 |
| 8,067,788 B2 | * | 11/2011 | Bito | 257/192 |
| 2007/0018199 A1 | * | 1/2007 | Sheppard et al. | 257/200 |
| 2009/0179258 A1 | * | 7/2009 | Otake | 257/329 |

FOREIGN PATENT DOCUMENTS

| JP | 63-015475 | | 1/1988 |
|---|---|---|---|
| KR | 1997-0003740 | A | 3/1997 |
| KR | 2007-0093074 | A | 9/2007 |

OTHER PUBLICATIONS

E. Y. Chang et al., "Submicron T-Shaped Gate HEMT Fabrication Using Deep-UV Lithography", IEEE Electron Device Letters, vol. 15, No. 8, pp. 277-279, Aug. 1994.
"Super Low-Noise HEMTs with a T-Shaped $WSi_x$ Gate", Electronics Letters, vol. 24, No. 21, pp. 1327-1328, Oct. 13, 1988.

* cited by examiner

*Primary Examiner* — Tuan N. Quach
(74) *Attorney, Agent, or Firm* — Rabin & Berdo, P.C.

(57) ABSTRACT

Provided are a method of manufacturing a normally-off mode high frequency device structure and a method of simultaneously manufacturing a normally-on mode high frequency device structure and a normally-off mode high frequency device structure on a single substrate.

13 Claims, 5 Drawing Sheets

METHOD OF MANUFACTURING HIGH FREQUENCY DEVICE STRUCTURE

CROSS-REFERENCE TO RELATED PATENT APPLICATION

This application claims priority from Korean Patent Application No. 10-2010-0123566, filed on Dec. 6, 2010, in the Korean Intellectual Property Office, the disclosure of which is incorporated herein in its entirety by reference.

BACKGROUND OF THE INVENTION

1. Field of the Invention

The present invention relates to a method of manufacturing a high frequency electronic device, and more particularly, to a method of manufacturing a normally-off mode high frequency device structure and a method of simultaneously manufacturing a normally-on mode high frequency device structure and a normally-off mode high frequency device structure on a single substrate.

2. Description of the Related Art

High frequency electronic devices, which are operated in a high frequency region, include high electron mobility transistors (HEMTs) and metal semiconductor field effect transistors (MESFETs), and HEMTs and MESFETs are generally formed of a Group III-V compound. HEMTs are distinguished from MESFETs in that charges are transferred from a doped charge donor layer to an undoped channel layer.

Normally-off mode high frequency devices, which are also called "enhancement-mode (E-mode) high frequency devices", are those that prevent the flow of current when no gate-source voltage is applied. On the other hand, normally-on mode high frequency devices, which are also called "depletion-mode (D-mode) high frequency devices", are those in which current flow occurs even when no gate-source voltage is applied.

HEMTs are typically operated in a normally-on mode. In order for normally-on mode HEMTs to be changed to an OFF state, a minus power is required for applying a negative potential to a gate electrode, thus making electric circuits expensive. Furthermore, normally-on mode HEMTs have a problem of excess current flow when a power is supplied, and thus, a special circuit for preventing such excess current flow is required.

In some digital logic circuits such as DCFLs (Direct Coupled FET Logics), however, it may be preferable to simultaneously form normally-on mode high frequency devices and normally-off mode high frequency devices in a single integrated circuit.

Generally, in normally-on mode high frequency devices, a Ti/Pt/Au multilayer is used as a gate electrode. Normally-off mode high frequency devices also employ a Ti/Pt/Au multilayer as a gate electrode, but the gate electrode is not effectively embedded into an underlying barrier layer, resulting in unstable normally-off mode high frequency devices.

SUMMARY OF THE INVENTION

The present invention provides a method of manufacturing a normally-off mode high frequency device structure that is thermally stable, and upon diffusion of a gate material, can significantly reduce the initial reaction energy of the gate material with a substrate material so that a gate electrode is effectively embedded into an underlying barrier layer.

The present invention also provides a method of simultaneously manufacturing a normally-on mode high frequency device structure and a normally-off mode high frequency device structure on a single substrate.

According to an aspect of the present invention, there is provided a method of manufacturing a high frequency device structure, the method including: forming a Schottky barrier layer, an etch stop layer, an ohmic layer and an ohmic electrode on a substrate; forming a first recess in such a manner that the etch stop layer is partially exposed; forming a gate pattern to correspond to the first recess and forming a second recess in such a manner that a portion of the Schottky barrier layer corresponding to the gate pattern is exposed; and forming a gate electrode in such a manner that platinum (Pt) and palladium (Pd) are alternately deposited in the gate pattern and the second recess to form a superlattice film, and a heat-resistant metal film is deposited on the superlattice film.

According to another aspect of the present invention, there is provided a method of manufacturing a high frequency device structure, the method including: forming a Schottky barrier layer, an etch stop layer, an ohmic layer and an ohmic electrode on a substrate; forming a first recess in a first active region in such a manner that a portion of the etch stop layer corresponding to the first active region is exposed and forming a second recess in a second active region in such a manner that a portion of the etch stop layer corresponding to the second active region is exposed; forming a first gate pattern to correspond to the first recess and forming a third recess in such a manner that a portion of the Schottky barrier layer corresponding to the first gate pattern is exposed, and forming a second gate pattern to correspond to the second recess and forming a fourth recess in such a manner that a portion of the Schottky barrier layer corresponding to the second gate pattern is exposed; and forming a first gate electrode in such a manner that a heat-resistant metal film is deposited in the first gate pattern and the third recess and forming a second gate electrode in such a manner that platinum (Pt) and palladium (Pd) are alternately deposited in the second gate pattern and the fourth recess to form a superlattice film, and a heat-resistant metal film is deposited on the superlattice film.

According to the method of manufacturing the normally-off mode high frequency device structure, platinum (Pt) and palladium (Pd) are alternately deposited to form a superlattice film, and a heat-resistant metal film is then formed on the superlattice film to thereby form a gate electrode. Therefore, the gate electrode is very stable against the subsequent dielectric film deposition and thermal treatment, and during Pt/Pd diffusion through the thermal treatment, it is possible to significantly reduce the initial reaction energy of Pt/Pd with a substrate material, and thus, the gate electrode is effectively embedded into an underlying barrier layer, thus enabling the fabrication of a stable normally-off mode high frequency device. Furthermore, due to the use of a single etch stop layer, it is possible to reduce the processes and costs required for device fabrication. In addition, due to a double-recessed structure including an upper gate recess and a lower gate recess narrower than the upper gate recess, the resultant device structure can have a higher breakdown voltage in connection with both normally-off and normally-on modes.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, the present invention will be described in more detail with reference to the accompanying drawings.

FIGS. 1A through 1F are sequential sectional views illustrating a method of manufacturing a normally-off mode high frequency device structure according to an embodiment of the present invention.

Figure 1A:
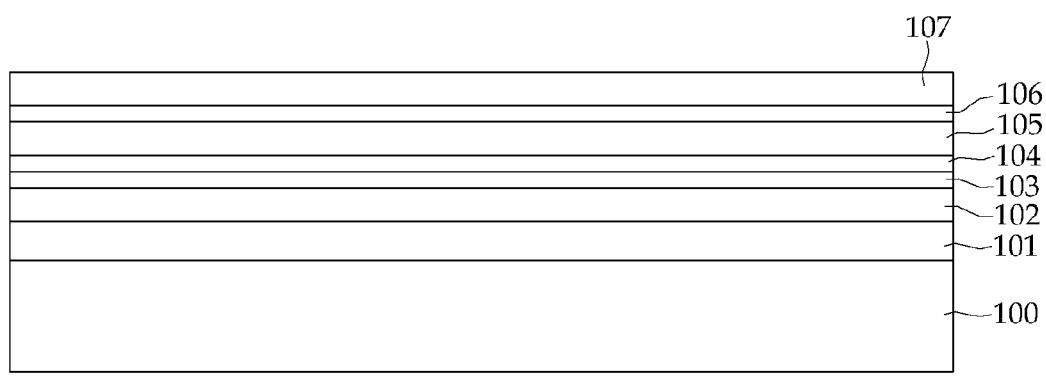
FIGS. 1A through 1F are sequential sectional views illustrating a method of manufacturing a normally-off mode high frequency device structure according to an embodiment of the present invention.

First, referring to FIG. 1A, an InAlAs buffer layer 101, an InGaAs channel layer 102, an InAlAs spacer layer 103, an electron donor layer 104, an InAlAs Schottky barrier layer 105, an AlAs etch stop layer 106 and an N-type InGaAs ohmic layer 107 are sequentially formed on a semiconductor InP substrate 100. Each of the buffer layer, the channel layer, the spacer layer, the electron donor layer, the Schottky barrier layer, the etch stop layer and the ohmic layer may be formed to a predetermined thickness through any method known in the art, and the scope of the present invention is not limited by them.

Figure 1B:
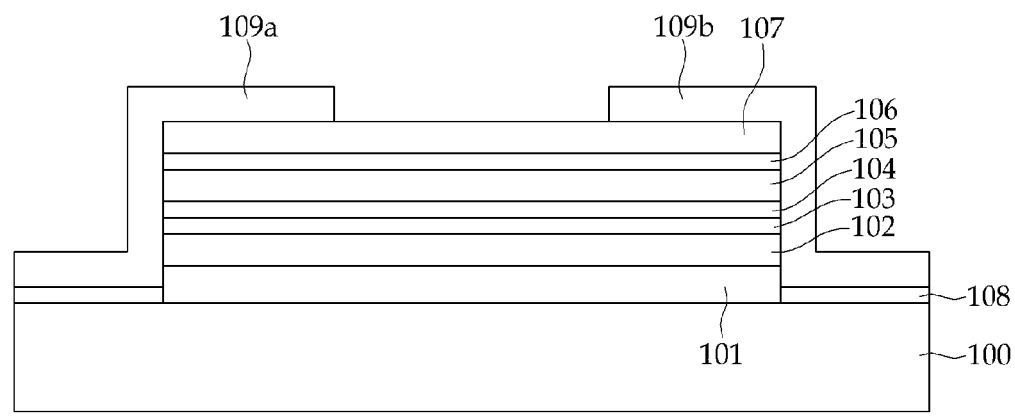

Next, referring to FIG. 1B, mesa regions 108 and ohmic electrodes 109a and 109b for a source and a drain are formed.

For example, the resultant structure of FIG. 1A is etched using a $H_3PO_4$-based wet etching solution in such a manner that the N-type InGaAs ohmic layer 107, the AlAs etch stop layer 106, the InAlAs Schottky barrier layer 105, the electron donor layer 104, the InAlAs spacer layer 103, and the InGaAs channel layer 102 are sequentially etched and the buffer layer 101 is then partially etched to define the mesa regions 108. Then, the ohmic electrodes 109a and 109b for the source and the drain are formed through a photoresist-based deposition process. The ohmic electrodes 109a and 109b may include an Au/Ni/Ge/Au multilayer and may be thermally treated to complete an ohmic contact. The thermal treatment may be performed at 600 to 1200° C. For a shorter process time, a rapid thermal process (RTP) may be used.

Figure 1C:
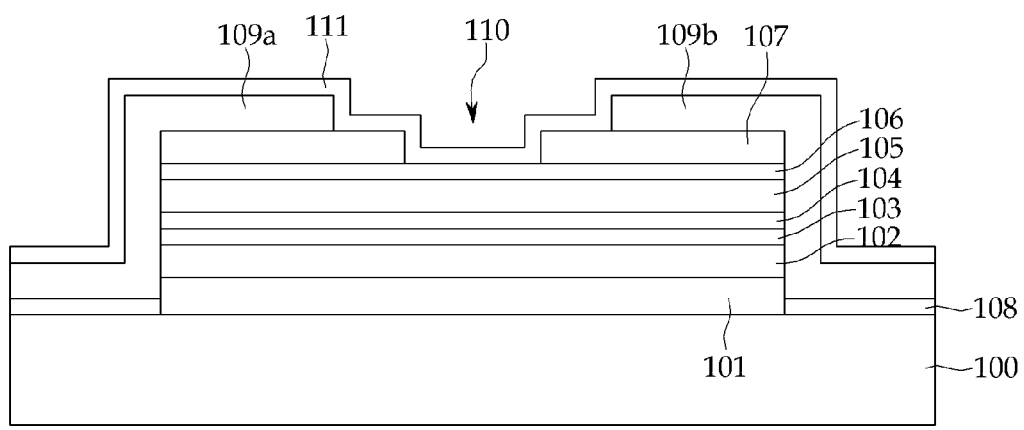

Next, referring to FIG. 1C, the ohmic layer 107 is partially etched so that the etch stop layer 106 is partially exposed to thereby form a first recess 110 with a wide width. Then, a dielectric layer 111 is formed on the entire surface of the resultant structure.

The first recess 110 may be formed using dry etching, wet etching or a combination thereof. For example, a wet etching process using a succinic acid solution may be used. Generally, the first recess 110 may be formed to a width of 500 to 1000 nm.

The dielectric layer 111 can protect devices from damage that may be caused during the subsequent gate pattern formation and may be formed of silicon oxide ($SiO_2$, $SiO_x$ etc.), silicon nitride ($Si_xN_y$), gallium nitride (GaN), aluminum nitride (AlN) or a combination thereof.

Figure 1D:
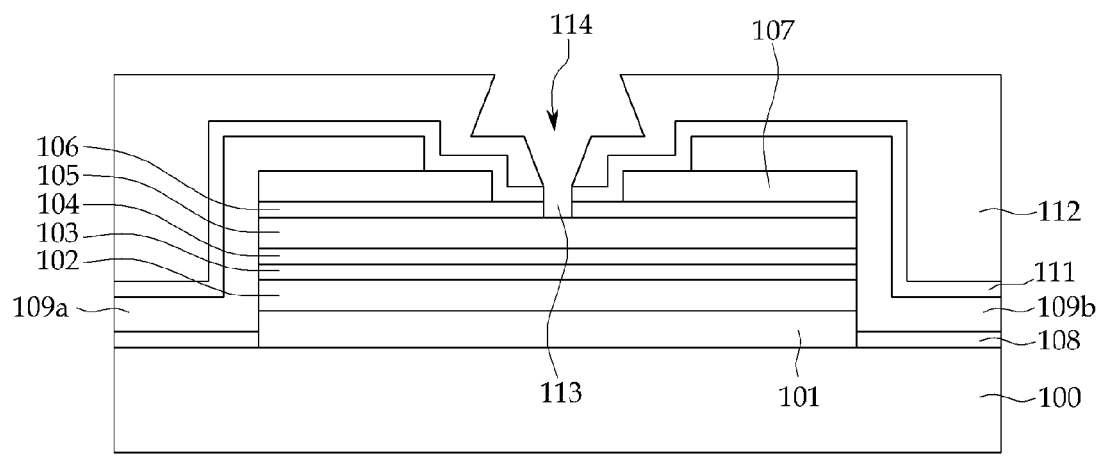

Next, referring to FIG. 1D, a gate pattern 114 is formed to correspond to the first recess 110. Then, portions of the dielectric layer 111 and the etch stop layer 106 corresponding to the gate pattern 114 are sequentially etched so that the Schottky barrier layer 105 is partially exposed to thereby form a second recess 113 with a narrow width.

For example, the gate pattern 114 may be formed by coating a resist 112 including PMMA (polymethylmethacrylate) and a MMA-MAA (methylmethacrylate-methacrylic acid) copolymer on the resultant structure of FIG. 1C followed by exposure to e-beam. FIG. 1D illustrates a T-shaped gate pattern, but the present invention is not limited thereto. A field-plate gate pattern may also be formed.

The second recess 113 may also be formed by dry etching, wet etching or a combination thereof. The second recess 113 may be formed to a narrower width than the first recess 110, generally to a width of 100 to 500 nm. Due to such a double-recessed structure, the resultant high frequency device can have a higher breakdown voltage as compared to a single-recessed structure.

Figure 1E:
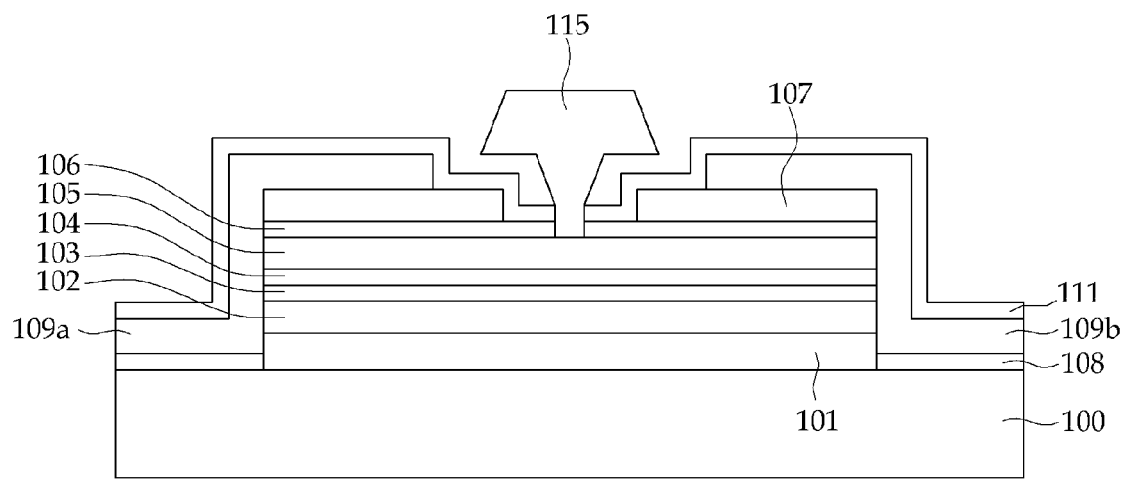

Next, referring to FIG. 1E, together with FIG. 1D, platinum (Pt) and palladium (Pd) are alternately deposited in the gate pattern 114 and the second recess 113 to form a superlattice film, and a heat-resistant metal film is then deposited on the superlattice film to thereby form a gate electrode 115. Then, the resist 112 is removed by a lift-off process.

The heat-resistant metal film can protect devices from the subsequent dielectric film deposition and thermal treatment, and the superlattice film can significantly reduce the initial reaction energy of Pt/Pd with a substrate material during Pt/Pd diffusion through the thermal treatment.

The superlattice film may be a 5- to 10-layered film formed through alternate deposition of Pt and Pd, and each layer of the superlattice film may have a thickness of 2 to 5 nm. When the layer number and layer thickness of the superlattice film satisfy the above-described requirements, the superlattice film can be effectively embedded into the underlying barrier layer 105 upon the subsequent thermal treatment, thus facilitating the fabrication of a gate electrode for a normally-off mode high frequency device.

The heat-resistant metal film may be a multi-layered metal film formed by sequentially depositing a heat-resistant metal compound, TiW and a heat-resistant metal, Mo. Here, the TiW layer and the Mo layer serve as barrier layers. The TiW layer and the Mo layer may be each formed to a thickness of 10 to 60 nm by a commonly known method, e.g., sputtering or thermal vacuum deposition.

According to a preferred embodiment, an Au layer may be further formed on the Mo layer of the gate electrode 115 in order to lower a gate resistance, thereby ensuring improved performance of high frequency devices.

The gate electrode 115 may be a T-shaped gate electrode in view of a reduction in a gate resistance, but the present invention is not limited thereto. A field-plate gate electrode may also be formed.

Figure 1F:
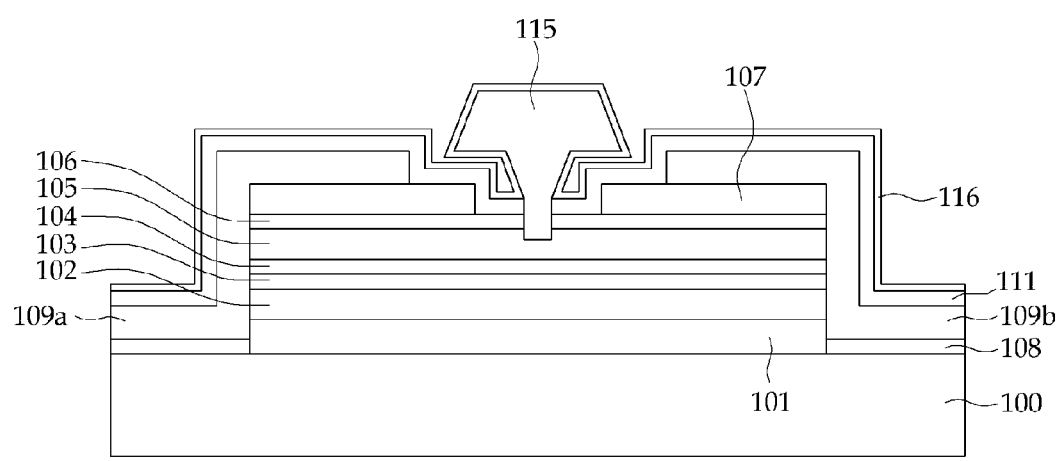

Next, referring to FIG. 1F, for device protection, a nitride-containing dielectric film 116, for example a nitride film or a multi-layered film comprised of an oxide layer and a nitride layer, may be deposited on the resultant structure of FIG. 1E and thermally treated. Through the thermal treatment, Pt and Pd constituting the superlattice film of the gate electrode 115 diffuse into the Schottky barrier layer 105 to thereby complete a normally-off mode high frequency device structure.

The nitride-containing dielectric film 116 may be formed by PECVD at 200 to 350° C. for 10 to 30 minutes. The final thermal treatment may be performed by rapid thermal annealing (RTA) at 250 to 350° C. for 10 to 30 seconds.

As described above, according to a method of manufacturing a normally-off mode high frequency device structure of the present invention, platinum (Pt) and palladium (Pd) are alternately deposited to form a superlattice film, and a heat-resistant metal film is then formed on the superlattice film to thereby form a gate electrode. Therefore, the gate electrode is very stable against the subsequent dielectric film deposition and thermal treatment, and during Pt/Pd diffusion through the thermal treatment, it is possible to significantly reduce the initial reaction energy of Pt/Pd with a substrate material, and thus, the gate electrode is effectively embedded into an underlying barrier layer, thus ensuring the fabrication of a stable normally-off mode high frequency device. Furthermore, due to the use of a single etch stop layer, it is possible to reduce the processes and costs required for device fabrication. In addition, due to a double-recessed structure including an upper gate recess and a lower gate recess narrower than the upper gate recess, the resultant device structure can have a higher breakdown voltage as compared to a single-recessed structure.

FIGS. 2A through 2F are sequential sectional views illustrating a method of simultaneously manufacturing a normally-off mode high frequency device structure and a normally-on mode high frequency device structure on a single substrate according to an embodiment of the present invention.

Figure 2A:
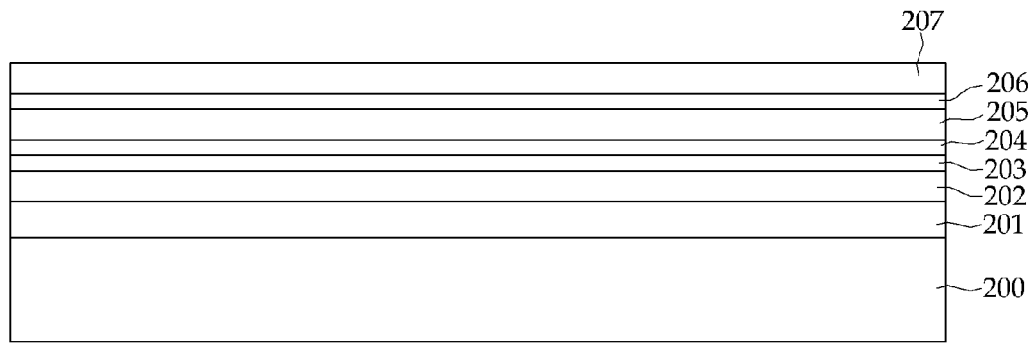
FIGS. 2A through 2F are sequential sectional views illustrating a method of simultaneously manufacturing a normally-off mode high frequency device structure and a normally-on mode high frequency device structure on a single substrate according to an embodiment of the present invention.

First, referring to FIG. 2A, an InAlAs buffer layer 201, an InGaAs channel layer 202, an InAlAs spacer layer 203, an electron donor layer 204, an InAlAs Schottky barrier layer 205, an AlAs etch stop layer 206 and an N-type InGaAs ohmic layer 207 are sequentially formed on a semiconductor InP substrate 200. Each of the buffer layer, the channel layer, the spacer layer, the electron donor layer, the Schottky barrier layer, the etch stop layer and the ohmic layer may be formed to a predetermined thickness through any method known in the art, and the scope of the present invention is not limited by them.

Figure 2B:
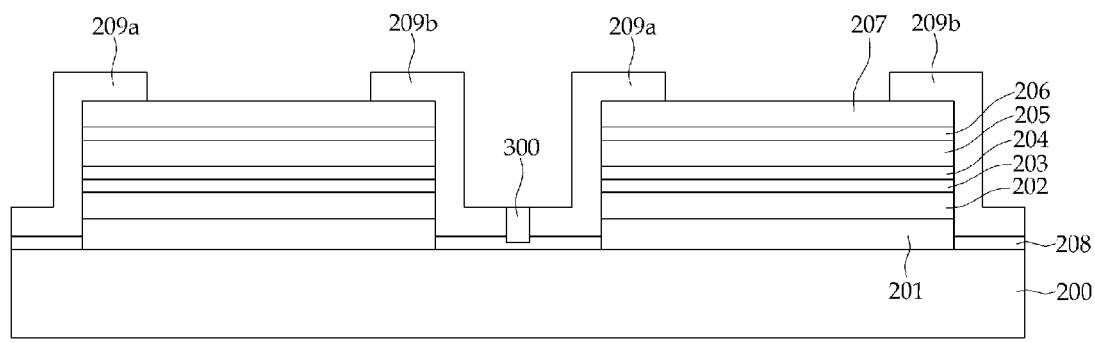

Next, referring to FIG. 2B, mesa regions 208 and ohmic electrodes 209a and 209b for sources and drains are formed, and a device isolation film 300 is then formed.

The formation of the mesa regions 208 and the ohmic electrodes 209a and 209b is as described above with reference to FIG. 1B, and thus, a detailed description thereof will be omitted herein.

The device isolation film 300 may be formed of an insulating material and may be extended to a buffer region, preferably to the buffer layer 201, from an upper surface of the resultant structure. For example, the device isolation film 300 may be formed by ion implantation followed by photolithography to define desired regions. Two active regions are defined by the device isolation film 300, i.e., a normally-on mode device structure region is defined on the left side of the device isolation film 300 and a normally-off mode device structure region is defined on the right side of the device isolation film 300.

Figure 2C:
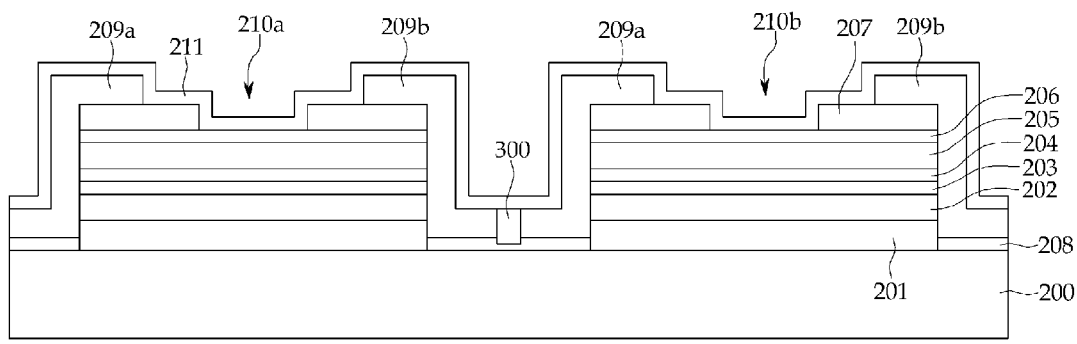

Next, referring to FIG. 2C, in the normally-on mode device structure region defined on the left side of the device isolation film 300, the ohmic layer 207 is partially etched so that the etch stop layer 206 is partially exposed to form a first recess 210a with a wide width. In the normally-off mode device structure region defined on the right side of the device isolation film 300, the ohmic layer 207 is partially etched so that the etch stop layer 206 is partially exposed to form a second recess 210b with a wide width. Then, a dielectric layer 211 is formed on the entire surface of the resultant structure.

The formation of the first recess 210a, the second recess 210b and the dielectric layer 211 is as described above with reference to FIG. 1C, and thus, a detailed description thereof will be omitted herein.

Figure 2D:
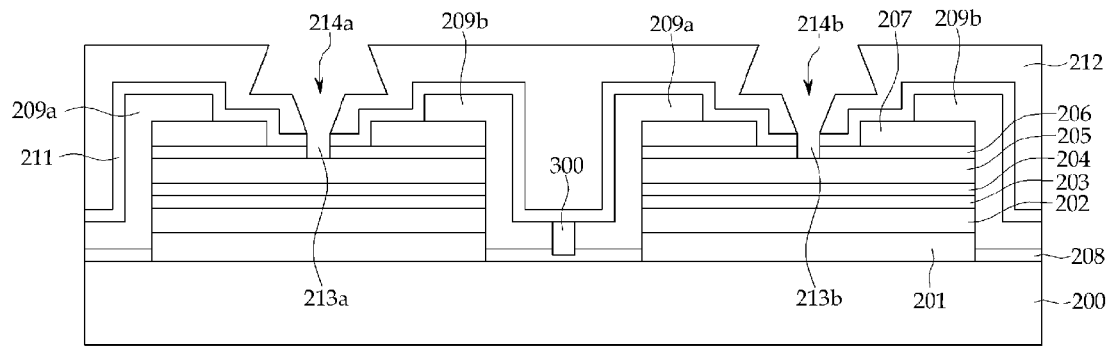

Next, referring to FIG. 2D, a first gate pattern 214a is formed to correspond to the first recess 210a, and portions of the dielectric layer 211 and the etch stop layer 206 corresponding to the first gate pattern 214a are sequentially etched so that the Schottky barrier layer 205 is partially exposed to form a third recess 213a with a narrow width. A second gate pattern 214b is formed to correspond to the second recess 210b, and portions of the dielectric layer 211 and the etch stop layer 206 corresponding to the second gate pattern 214b are sequentially etched so that the Schottky barrier layer 205 is partially exposed to form a fourth recess 213b with a narrow width.

The formation of the first gate pattern 214a, the second gate pattern 214b, the third recess 213a, and the fourth recess 213b is as described above with reference to FIG. 1D, and thus, a detailed description thereof will be omitted herein.

Figure 2E:
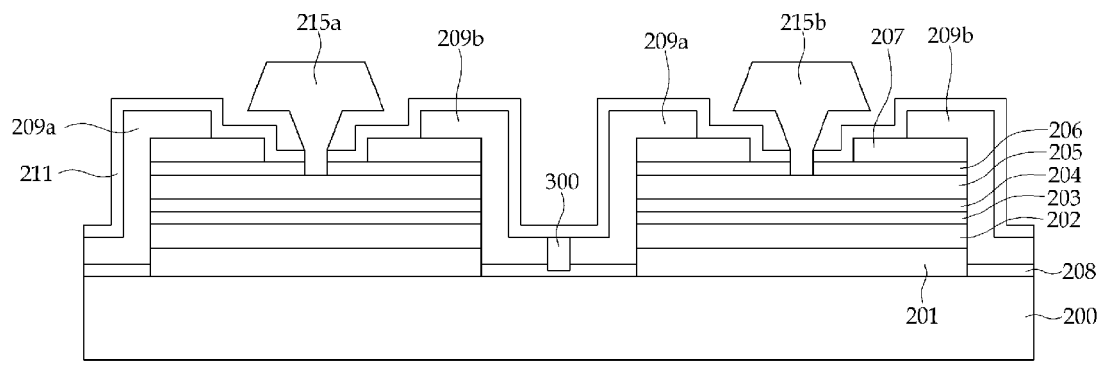

Next, referring to FIG. 2E, together with FIG. 2D, a heat-resistant metal film is deposited in the first gate pattern 214a and the third recess 213a to form a first gate electrode 215a for a normally-on mode operation. Pt and Pd are alternately deposited in the second gate pattern 214b and the fourth recess 213b to form a superlattice film, and a heat-resistant metal film is then deposited on the superlattice film to form a second gate electrode 215b for a normally-off mode operation. Then, a resist 212 is removed by a lift-off process.

As described above, the heat-resistant metal film can protect devices from the subsequent dielectric film deposition and thermal treatment, and the superlattice film can significantly reduce the initial reaction energy of Pt/Pd with a substrate material during Pt/Pd diffusion through the thermal treatment, and thus, the gate electrode 215b can be effectively embedded into the underlying barrier layer 205, thus ensuring the fabrication of a stable normally-off mode high frequency device.

The superlattice film may be a 5- to 10-layered film formed through alternate deposition of Pt and Pd, and each layer of the superlattice film may have a thickness of 2 to 5 nm. When the layer number and layer thickness of the superlattice film satisfy the above-described requirements, the superlattice film can be effectively embedded into the underlying barrier layer 205 upon the subsequent thermal treatment, thus facilitating the fabrication of a gate electrode for a normally-off mode high frequency device.

The heat-resistant metal film may be a multi-layered metal film formed by sequentially depositing a heat-resistant metal compound, TiW and a heat-resistant metal, Mo. Here, the TiW layer and the Mo layer serve as barrier layers. The TiW layer and the Mo layer may be each formed to a thickness of 10 to 60 nm by a commonly known method, e.g., sputtering or thermal vacuum deposition.

According to a preferred embodiment, an Au layer may be further formed on the Mo layers of the first and second gate electrodes 215a and 215b in order to lower a gate resistance, thereby ensuring improved performance of high frequency devices.

Figure 2F:
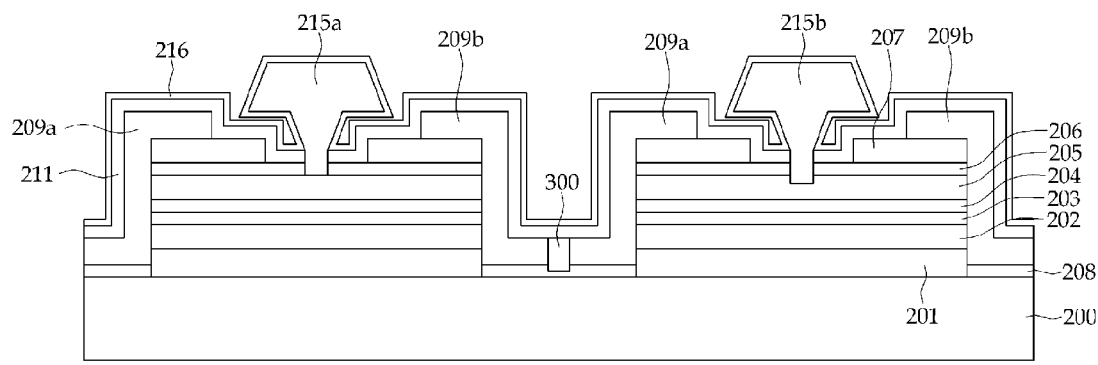

Next, referring to FIG. 2F, for device protection, a nitride-containing dielectric film 216, for example a nitride film or a multi-layered film comprised of an oxide layer and a nitride layer, may be deposited on the resultant structure of FIG. 2E and thermally treated. Through the thermal treatment, Pt and Pd constituting the superlattice film of the second gate electrode 215b diffuse into the Schottky barrier layer 205 to thereby complete a normally-off mode high frequency device structure.

The nitride-containing dielectric film 216 may be formed by PECVD at 200 to 350° C. for 10 to 30 minutes. The final thermal treatment may be performed by RTA at 250 to 350° C. for 10 to 30 seconds.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a high frequency device structure, the method comprising:

forming a Schottky barrier layer, an etch stop layer, an ohmic layer and an ohmic electrode on a substrate;

forming a first recess in such a manner that the etch stop layer is partially exposed;

forming a gate pattern to correspond to the first recess and forming a second recess in such a manner that a portion of the Schottky barrier layer corresponding to the gate pattern is exposed; and forming a gate electrode in such a manner that platinum (Pt) and palladium (Pd) are alternately deposited in the gate pattern and the second recess to form a superlattice film, and a heat-resistant metal film is deposited on the superlattice film.

2. The method of claim 1, after the formation of the gate electrode, further comprising depositing a nitride-containing dielectric film on the resultant structure followed by thermal treatment.

3. The method of claim 1, wherein the superlattice film is a 5- to 10-layered film formed through alternate deposition of Pt and Pd.

4. The method of claim 1, wherein in the formation of the gate electrode, the heat-resistant metal film of the gate electrode is a multi-layered metal film formed through sequential deposition of TiW and Mo.

5. The method of claim 4, wherein the gate electrode further comprises an Au layer formed on the Mo layer.

6. The method of claim 1, wherein the first recess is formed to a wider width than the second recess.

7. A method of manufacturing a high frequency device structure, the method comprising:

forming a Schottky barrier layer, an etch stop layer, an ohmic layer and an ohmic electrode on a substrate;

forming a first recess in a first active region in such a manner that a portion of the etch stop layer corresponding to the first active region is exposed and forming a second recess in a second active region in such a manner that a portion of the etch stop layer corresponding to the second active region is exposed;

forming a first gate pattern to correspond to the first recess and forming a third recess in such a manner that a portion of the Schottky barrier layer corresponding to the first gate pattern is exposed, and forming a second gate pattern to correspond to the second recess and forming a fourth recess in such a manner that a portion of the Schottky barrier layer corresponding to the second gate pattern is exposed; and forming a first gate electrode in such a manner that a heat-resistant metal film is deposited in the first gate pattern and the third recess, and forming a second gate electrode in such a manner that platinum (Pt) and palladium (Pd) are alternately deposited in the second gate pattern and the fourth recess to form a superlattice film, and a heat-resistant metal film is deposited on the superlattice film.

8. The method of claim 7, after the formation of the first and second gate electrodes, further comprising depositing a nitride-containing dielectric film on the resultant structure followed by thermal treatment.

9. The method of claim 7, wherein the superlattice film is a 5- to 10-layered film formed through alternate deposition of Pt and Pd.

10. The method of claim 7, wherein in the formation of the first and second gate electrodes, the heat-resistant metal film of each of the first and second gate electrodes is a multi-layered metal film formed through sequential deposition of TiW and Mo.

11. The method of claim 10, wherein each of the first and second gate electrodes further comprises an Au layer formed on the Mo layer.

12. The method of claim 7, after the formation of the Schottky barrier layer, the etch stop layer, the ohmic layer and the ohmic electrode, further comprising forming a device isolation film to define the first and second active regions.

13. The method of claim 7, wherein the first recess is formed to a wider width than the third recess, and the second recess is formed to a wider width than the fourth recess.

* * * * *